United States Patent [19]
Rösner et al.

[11] Patent Number: 6,037,209
[45] Date of Patent: Mar. 14, 2000

[54] METHOD FOR PRODUCING A DRAM CELLULAR ARRANGEMENT

[75] Inventors: Wolfgang Rösner, München; Lothar Risch, Neubiberg; Franz Hofmann, München; Reinhard Stengl, Stadtbergen, all of Germany

[73] Assignee: Siemens Aktiengesellschaft, Munich, Germany

[21] Appl. No.: 09/254,696

[22] PCT Filed: Jul. 28, 1997

[86] PCT No.: PCT/DE97/01580

§ 371 Date: Mar. 15, 1999

§ 102(e) Date: Mar. 15, 1999

[87] PCT Pub. No.: WO98/11604

PCT Pub. Date: Mar. 19, 1998

[30] Foreign Application Priority Data

Sep. 13, 1996 [DE] Germany .................. 196 37 389

[51] Int. Cl.[7] .................................................. H01L 21/8242
[52] U.S. Cl. .......................... 438/244; 438/253; 438/396
[58] Field of Search ................................ 438/243, 244, 438/253, 254, 255, 256, 396, 387, 397, 398, 399

[56] References Cited

U.S. PATENT DOCUMENTS

| 5,290,723 | 3/1994 | Tani et al. . |
| 5,357,131 | 10/1994 | Sunami et al. . |
| 5,554,557 | 9/1996 | Koh .................................... 438/396 |
| 5,627,095 | 5/1997 | Koh et al. ............................ 438/672 |
| 5,940,676 | 8/1999 | Fazan et al. .......................... 438/3 |

FOREIGN PATENT DOCUMENTS

| 43 28 510 A1 | 3/1994 | Germany . |
| 195 19 160 C1 | 9/1996 | Germany . |
| 2 293 690 | 4/1996 | United Kingdom . |
| WO 93/12542 | 6/1993 | WIPO . |

OTHER PUBLICATIONS

S. Maeda et al., IEEE Transactions on Electron Devices, vol. 42, No. 12, Dec. 1995, pp. 2117–2124.
Y. Kawamoto et al., 1990 Symposium on VLSI Technology, pp. 13–14.
Japanese Abstract, Publication No. 60021558.
K. Yamada et al., "A Deep–Trenched Capacitor Technology for 4 Mega Bit Dynamic Ram", IEDM 85, pp. 702–705.

*Primary Examiner*—Tuan H. Nguyen
*Attorney, Agent, or Firm*—Hill & Simpson

[57] ABSTRACT

The DRAM cell arrangement comprises, per memory cell, a vertical MOS transistor whose first source/drain region is connected to a storage node of a storage capacitor, whose channel region (3) is annularly enclosed by a gate electrode (13) and whose second source/drain region is connected to a buried bit line. The DRAM cell arrangement is produced using only two masks, with the aid of a spacer technique, with a memory cell area of $2F^2$, where F is the minimum structure size which can be produced using the respective technology.

7 Claims, 4 Drawing Sheets

METHOD FOR PRODUCING A DRAM CELLULAR ARRANGEMENT

BACKGROUND OF THE INVENTION

1. Field of the Invention

The present invention relates generally to a method for producing a DRAM cell including a vertical transistor.

2. Description of the Related Art

In DRAM cell arrangements, that is to say memory cell arrangements with dynamic random access, use is made almost exclusively of so-called single-transistor memory cells. A single-transistor memory cell comprises a read-out transistor and a storage capacitor. The information is stored in the storage capacitor in the form of an electric charge, which represents a logic value, zero or one. By driving the read-out transistor via a word line, this information can be read out via a bit line.

Since the storage density increases from memory generation to memory generation, the required area of the single-transistor memory cell must be reduced from generation to generation. Since limits are imposed on the reduction of the structure sizes by the minimum structure size F which can be produced using the respective technology, this is also associated with an alteration of the single-transistor memory cell. Thus, up until the 1 Mbit generation, both the read-out transistor and the storage capacitor were realized as planar components. Starting with the 4 Mbit memory generation, a further reduction in area had to be effected by means of a three-dimensional arrangement of the read-out transistor and the storage capacitor. One possibility is to realize the storage capacitor in a trench (see, for example K. Yamada et al., A deep trenched capacitor technology for 4 Mbit DRAMs, Proc. Intern. Electronic Devices and Materials IEDM 85, page 702).

Furthermore, it has been proposed (see, for example, Y. Kawamoto et al., A 1,28 $\mu m^2$ Bit-Line Shielded Memory Cell Technology for 64 Mbit DRAMs Techn. Digest of VLSI Symposium 1990, page 13) to design the storage capacitor as a so-called stacked capacitor. In this case, a polysilicon structure, for example a crown structure or a cylinder, is formed over the word lines and makes contact with the substrate. This polysilicon structure the storage node. It is provided with a capacitor dielectric and capacitor plate. This concept has the advantage that it is largely compatible with a logic process.

The area for a memory cell of a DRAM belonging to the 1 Gbit generation should only be about 0.2 $\mu m^2$. At the same time, the storage capacitor must have a capacitance of 20 to 30 fF. In the case of a cell area such as is available in the 1 Gbit generation, such a capacitance is feasible in a stacked capacitor only with a relatively complicated structure of the polysilicon structure. These complicated structures are more and more difficult to produce, in addition, due to their topology.

Furthermore, it has been proposed to increase the capacitance which can be achieved per area by using a dielectric having a high dielectric constant. Paraelectric and ferroelectric materials, in particular, are suitable as dielectric having a high dielectric constant (see Published PCT application no. WO 93/12542), for example).

The present invention is based on the problem of specifying a method for the production of a DRAM cell arrangement whose memory cells comprise single-transistor memory cells, by means of which method it is possible to achieve the component density which is necessary for the 1 Gbit generation.

This problem is solved by a method for the production of a DRAM cell arrangement.

in which a first mask layer and a second mask layer, which can be etched selectively with respect to one another, are applied to a semiconductor substrate comprising a first layer which is doped by a first conductivity type, a second layer, which is doped by a second conductivity type opposite to the first, and a third layer, which is doped by the first conductivity type and adjoins a main area of the semiconductor substrate, in which the second mask layer and the first mask layer are structured jointly, in which the structured first mask layer is etched back under the structured second mask layer by means of selective etching, in which the structured second mask layer is removed, in which spacers made of a material which can be etched selectively with respect to the material of the structured first mask layer are formed on the flanks of the structured first mask layer, in which a third mask layer having essentially conformal edge covering is applied, it having the same etching properties as the first mask layer, in which the third mask layer is etched back selectively with respect to the spacers until the surface of the spacers is partially exposed, in which the spacers are removed selectively with respect to the structured first mask layer and with respect to the structured third mask layer, in which, using the structured first mask layer and the structured third mask layer as an etching mask, first trenches are etched, which first trenches are each in strip form, run essentially parallel and cut through the first layer, the second layer and the third layer, in which the first trenches are filled with a first insulation structure, in which second trenches are etched, which second trenches are each in strip form, run essentially parallel, cross the first trenches and reach down into the first layer without cutting through the first layer, in which the second trenches are provided with a second insulation structure, in which the width of the second trenches is greater than the width of the first trenches, in which the first insulation structures and the second insulation structures are etched selectively with respect to the semiconductor material until the surfaces of the structured second layer and third layer are exposed on the flanks of the first trenches and of the second trenches, in which a gate oxide is formed, which gate oxide covers at least the exposed surface of the second layer, in which, in order to form gate electrodes, a conductive layer having essentially conformal edge covering is produced, the thickness of which conductive layer is dimensioned such that it fills the first trenches but does not fill the second trenches, and which conductive layer is etched back anisotropically such that conductive spacers are produced on the flanks of the second trenches and the surface of the second insulation structures is partially exposed in the second trenches, while the surface of the first insulation structure in the first trenches remains covered by conductive material, in which a third insulation structure, which covers the gate electrodes, is produced, in which storage capacitors are produced which each have a storage node which is electrically connected to the structured third layer. Further refinements of the invention are provided by a method in which the first mask layer and the third mask layer are each formed from $SiO_2$ and the second mask layer and the spacers are each formed from $Si_3N_4$, and the conductive layer is formed from doped polysilicon. Preferably, the semiconductor substrate comprises monocrystalline silicon at least in the region of the main area, and the first layer, the second layer and the third layer are grown on epitaxially. A conductive layer made of $CoSi_2$, that is grown on expitaxially, is produced under the first layer and is cut through during the etching of the first trenches in one embodiment. In order to form the storage capacitors, a capacitor dielectric and a capacitor plate are applied above the structured third layer, with the result that the structured third layer simultaneously acts as a storage node. The capacitor dielectric may be formed from one of the materials barium strontium titanate, strontium titanate or lead zirconium titanate. The capacitor dielectric may be formed as a continuous layer.

A first mask layer and a second mask layer, which can be etched selectively with respect to one another, are applied to a semiconductor substrate comprising a first layer, which is doped by a first conductivity type, a second layer, which is doped by a second conductivity type opposite to the first, and a third layer, which is doped by the first conductivity type and adjoins a main area of the semiconductor substrate. The second mask layer and the first mask layer are structured jointly.

By selective etching, the structured first mask layer is etched back laterally under the structured second mask layer. The structured second mask layer is subsequently removed.

Spacers made of a material which can be etched selectively with respect to the material of the structured first mask layer are formed on the flanks of the structured first mask layer.

A third mask layer having essentially conformal edge covering is applied, it having the same etching properties as those of the first mask layer. The third mask layer is etched back selectively with respect to the spacers, until the surface of the spacers is partially exposed. The spacers are then removed selectively with respect to the structured first mask layer and with respect to the structured third mask layer.

Using the structured first mask layer and the structured third mask layer as an etching mask, first trenches are etched, which first trenches are each in strip form, run essentially parallel and cut through the first layer, the second layer and the third layer. The first trenches are filled with a first insulation structure.

Second trenches are then etched, which second trenches are each in strip form, run essentially parallel, cross the first trenches and reach down into the first layer without cutting through the first layer. The second trenches are provided with a second insulation structure.

The first insulation structures and the second insulation structures are etched selectively with respect to the semiconductor material, until the surfaces of the structured second layer and third layer are exposed on the flanks of the first trenches and of the second trenches.

A gate oxide which covers at least the exposed surface of the second layer is then formed. A conductive layer having essentially conformal edge covering is subsequently produced for the purpose of forming gate electrodes. The conductive layer is preferably formed from doped polysilicon, since this material can be deposited with good conformity. Alternatively, the conductive layer may be formed from metal silicide or metal, for example tungsten, or from a combination of these materials with doped polysilicon.

The first trenches are produced with a smaller width than the second trenches. The thickness of the conductive layer is dimensioned such that the conductive layer fills the first trenches but does not fill the second trenches. By anisotropically etching back the conductive layer, the surface of the second insulation structure is partially exposed in the second trenches. In the process, doped, conductive spacers remain on the flanks of the second trenches. During this process of anisotropic etching-back, although the conductive material remaining in the first trenches is likewise attacked, the surface of the first insulation structures in the first trenches remains covered with conductive material. In this way, the gate electrodes turn out to be annular structures made of conductive material, in which case that part of the structure which is arranged in each case in the first trenches belongs to two neighbouring gate electrodes and connects the latter to one another in a production-conforming manner.

The gate electrodes are finally covered with a third insulation structure. The third insulation structure essentially completely fills the first trenches and the second trenches above the gate electrodes. In the second trenches, the third insulation structure insulates gate electrodes which are arranged on opposite flanks. The capacitor dielectric and the capacitor plate are subsequently applied. The third insulation structure is preferably produced likewise by depositing a layer having essentially conformal edge covering and etching-back the layer.

For self-aligning production, it is essential that the width of the first trenches and of the second trenches differ such that the conductive layer fills the first trenches but not the second trenches. This makes it possible to structure the gate electrodes, which simultaneously form the word lines, without photolithographic steps. In this method, only two photolithographic steps are required: the structuring of the first mask layer and of the second mask layer and the etching of the second trenches are both carried out each using a lithographically reduced mask. However, these masks are completely non-critical as regards their alignment.

The structured third layer forms a first source/drain region of vertical MOS transistors which in each case constitute the read-out transistors of the single-transistor memory cells of the DRAM cell arrangement. The structured first layer forms buried bit lines and, adjoining the latter, second source/drain regions of the vertical MOS transistors.

Between the first source/drain region and the second source/drain region, the structured second layer forms a channel region which is annularly surrounded by the gate oxide and the gate electrode. The gate electrodes of vertical MOS transistors which are adjacent along a word line adjoin one another and jointly form the word line.

The storage capacitor of the single-transistor memory cells is in each case formed above the main area. This comprises a storage node which is electrically connected to the first source/drain region. The storage node can be designed either in a planar manner or as a polysilicon structure of greater or lesser complexity, as is known from stacked capacitors.

In accordance with one embodiment, a capacitor dielectric is formed on the main area, on the surface of the first source/drain region adjoining the main area, and a capacitor plate is formed over the capacitor dielectric. In this embodiment, the first source/drain region adjoining the main area is additionally used as a storage node for the storage capacitor formed by the capacitor plate, capacitor dielectric and source/drain region. In order to attain a sufficient capacitance given a small area of the storage node, it is advantageous here to use a material having a relative permittivity in the range between 100 and 1000 as the capacitor dielectric.

The DRAM cell arrangement is preferably realized in a semiconductor substrate which comprises monocrystalline silicon at least in the region for the DRAM cell arrangement. That may be either a wafer made of monocrystalline silicon throughout or an SOI (silicon on insulate) substrate, which, on a silicon wafer, comprises an insulating layer and, on the latter, a thin monocrystalline silicon layer.

With the use of the first source/drain region as a storage node, the DRAM cell arrangement according to the invention can be produced with a planar surface or with a surface having a flat topology, thereby making it possible to use a ferroelectric layer or paraelectric layer as the capacitor dielectric. Ferroelectric and paraelectric layers have a high relative permittivity $\in_r$ in the range from 500 to 1000. If these layers are deposited by sputtering, they can only be used on planar surfaces or surfaces having a flat topology. Even with CVD (chemical vapor deposition) or sol-gel methods with better edge covering, complicated 3D structures cannot be produced due to the required thickness of the layers. Barium strontium titanate, strontium titanate or lead zirconium titanate is preferably used as the capacitor dielectric. Furthermore, the materials disclosed in published PCT application no. WO 93/12542 are suitable as the capacitor dielectric. With these dielectrics having a high relative permittivity, it is possible to attain the necessary capacitance of 20 to 30 fF even on an area of about 0.1 to 0.4 $\mu m^2$.

In the method according to the invention, the first trenches can be produced with a width which is less than the corresponding minimum structure size F which can be produced using the respective technology. If the first mask layer and the second mask layer are structured in strip form with a strip width and a strip spacing of a minimum structure size F, for example 0.25 $\mu m$, in the respective technology, the width of the first trenches is less than F/2, since the structured first mask layer is used together with the structured third mask layer as mask and the structure sizes in the structured first mask layer and the structured third mask layer are reduced to below F/2 by the undercutting of the structured first mask layer, the formation of the spacers, the self-aligned formation of the structured third mask layer and the removal of the spacers.

If the width of the second trenches is also a minimum structure size F, for example 0.25 $\mu m$, in the respective technology, then the DRAM cell arrangement can be produced with a space requirement per memory cell of $2F^2$.

It lies within the scope of the invention to grow on epitaxially the regions for the source/drain regions and the channel region as well as the bit lines as whole-area layers. In this case, it is possible, given the use of a substrate which comprises monocrystalline silicon in the region of the DRAM cell arrangement, to produce a conductive layer made of $CoSi_2l$ grown on epitaxially, for the purpose of improving the conductivity of the bit lines under the second source/drain regions. This conductive layer is likewise cut through during the etching of the first trenches and is a component part of the bit lines.

BRIEF DESCRIPTION OF THE DRAWINGS

The invention is explained in more detail below using an exemplary embodiment which is illustrated in the Figures.

DETAILED DESCRIPTION OF THE PREFERRED EMBODIMENTS

Figure 1:
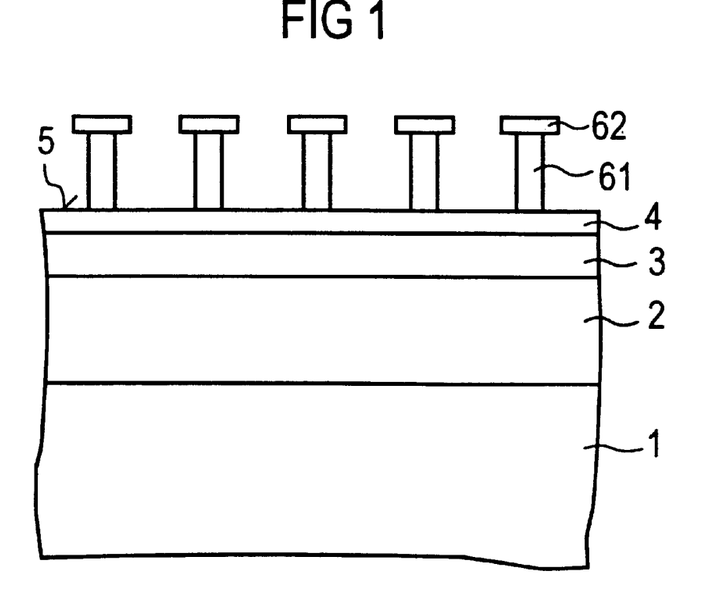
FIG. 1 is a side cross sectional view which shows a semiconductor substrate with a structured first mask layer and a structured second mask layer.

The starting material is a substrate having a region 1 made, for example, of p-doped, monocrystalline silicon with a dopant concentration of, for example, $10^{17}$ $cm^{-3}$, which is provided with a first layer 2 made of $n^+$-doped silicon with a dopant concentration of, for example, $10^{20}$ $cm^{-3}$, with a second layer 3 made of p-doped silicon with a dopant concentration of, for example, $3\times10^{17}$ $cm^{-3}$ and a third layer 4 made of $n^+$-doped silicon with a dopant concentration of, for example, $10^{21}$ $cm^{-3}$ (see FIG. 1). The first layer 2, the second layer 3 and the third layer 4 are preferably produced by being grown on epitaxially. The third layer 4 forms a main area 5 of the substrate. The first layer 2 has a thickness of, for example, 500 nm, the second layer 3 has a thickness of, for example, 200 nm and the third layer 4 has a thickness of, for example, 100 nm.

A first mask layer 61 and a second mask layer 62 are applied to the main area 5 and structured. The first mask layer 61 is deposited, for example, from $SiO_2$ using a TEOS (tetra-ethoxy-silane) method to a thickness of 400 nm. The second mask layer 62 is deposited, for example, from $Si_3N_4$ using a CVD (chemical vapor deposition) method to a thickness of 50 nm. A photoresist mask (not illustrated) is used to structure the first mask layer 61 and the second mask layer 62. The structuring is carried out in a dry etching process using $CHF_3$ and $O_2$. The area 5 is exposed in the process.

After the removal of the photoresist mask, the structured first mask layer 61 is etched back, by selective, for example wet-chemical etching using $NH_4F$ and HF, by, for example, 65 nm under the edges of the structured second mask layer 62.

After the removal of the structured second mask layer 62, an etching stop layer 71 is deposited from $SiO_2$, for example, using a TEOS method to a thickness of 20 nm. Spacers 72 made, for example, of $Si_3N_4$ are then formed on vertical flanks of the structured first mask layer 61. For this purpose, an $Si_3N_4$ layer is deposited using a CVD method to a layer thickness of, for example, 90 nm. The spacers 72 are formed by anisotropic dry etching selectively with respect to $SiO_2$ using, for example, $CHF_3$, $O_2$ (see FIG. 2). The spacers 72 may also be formed from polysilicon.

Figure 2:
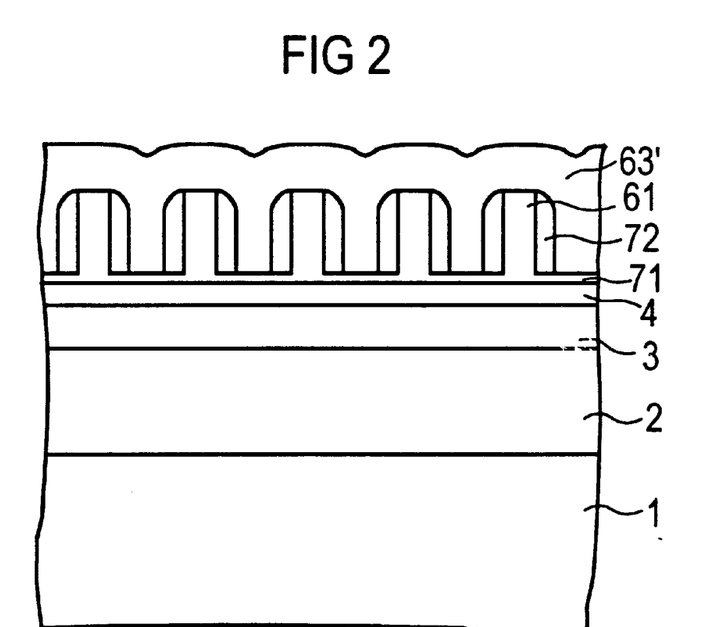
FIG. 2 is a side cross sectional view which shows the semiconductor substrate after the formation of an etching stop layer, spacers and a third mask layer.

A third mask layer 63' is then deposited, for example, from $SiO_2$ using a TEOS method to a thickness of 200 nm. The third mask layer 63' completely fills the interspaces between neighbouring spacers 72.

Figure 3:
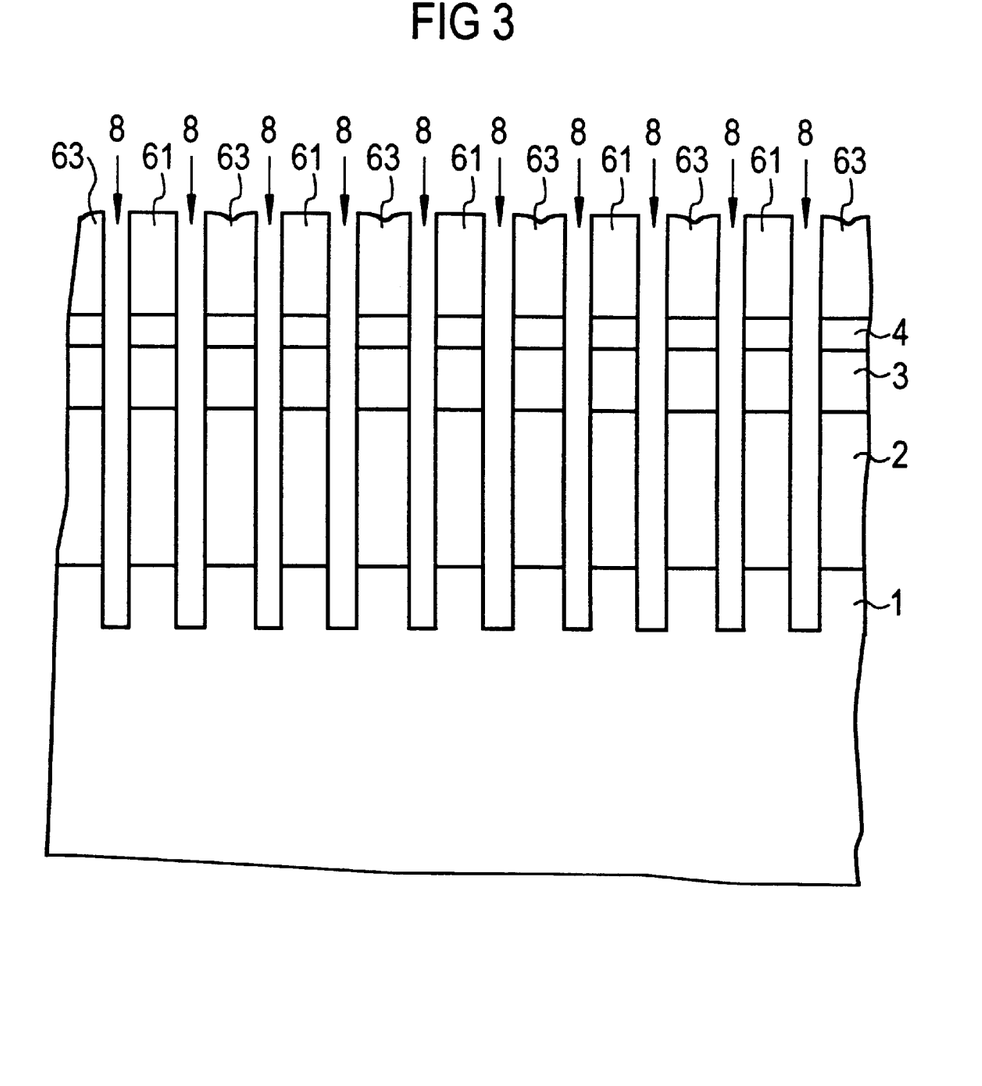
FIG. 3 is a side cross sectional view which shows the semiconductor substrate after the structuring of the third mask layer, removal of the spacers and etching of first trenches.

The third mask layer 63' is structured by being etched back by anisotropic dry etching using, for example, $CHF_3$ and $O_2$. The etching operation is continued until the surface of the spacers 72 is exposed in the upper region. The spacers 72 are subsequently removed selectively with respect to the structured third mask layer 63 and with respect to the structured first mask layer 61, for example wet-chemically using $H_3PO_4$ at 155° C. In the process, the surface of the etching stop layer 71 is exposed between the parts of the structured first mask layer 61 and of the structured third mask layer 63.

Using the structured first mask layer 61 and the structured third mask layer 63 as an etching mask, first trenches 8 are etched in an anisotropic dry etching process (see FIG. 3). In this case, the etching stop layer 71 is first of all removed by anisotropic etching using $CHF_3$, $O_2$, HBr, $NF_3$, He, $O_2$, for example, is suitable as etching process for the silicon etching. The first trenches 8 are produced with a depth of, for example, 1000 nm. As a result, the first trenches 8 reach down into the p-doped region 1 of the semiconductor substrate. The first trenches 8 cut through the first layer 2, the second layer 3 and the third layer 4. The first trenches 8 have a strip-shaped cross-section parallel to the main area 5. The first trenches 8 run essentially parallel over the entire cell array. The first trenches 8 have a width of, for example, 90 nm and a length of 64 μm. The distance between the centers of neighbouring first trenches 8 is, for example, 250 nm, which corresponds to the minimum structure size F=250 nm in the technology used.

The structured first mask layer 61 and the structured third mask layer 63 are subsequently removed by wet-chemical etching using, for example, $NH_4F(30\%)/HF(6\%)$.

The first trenches 8 are filled with a first insulation structure 9 by depositing an $SiO_2$ layer using a TEOS method to a layer thickness of 100 nm. In order to form the first insulation structure 9, the $SiO_2$ layer is etched back and planarized until the main area 5 is exposed outside the trenches 8. The etching back is carried out in a dry etching process, for example using $CHF_3$ and $O_2$.

Figure 4:
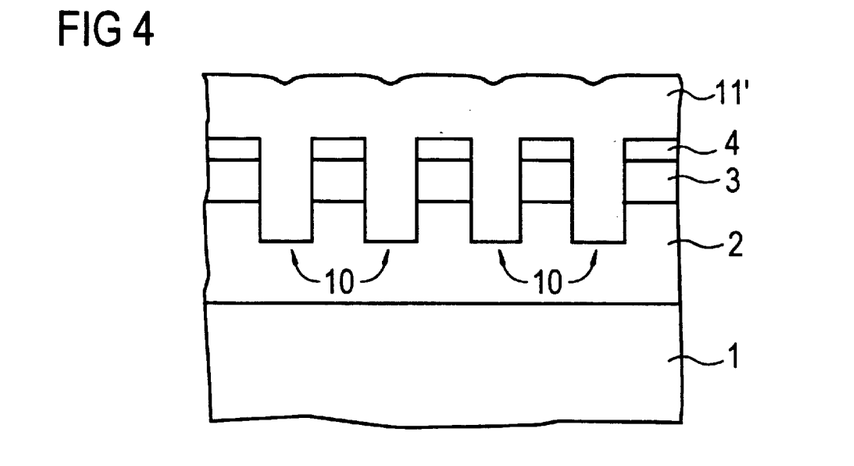
FIG. 4 shows a section perpendicular to the section shown in FIG. 3, through the semiconductor substrate after the etching of second trenches and filling of the second trenches.

A further mask is subsequently produced with the aid of photolithographic methods, which further mask is used as an etching mask for the etching of second trenches 10 (see FIG. 4). In order to form the second trenches 10, it is necessary to use an etching method which attacks silicon selectively with respect to $SiO_2$. HBr, $Cl_2$, He and $O_2$ is particularly suitable for this purpose. The second trenches 10 run, for example, perpendicularly to the first trenches 8 (FIG. 4 shows a section through the arrangement which is perpendicular to FIG. 3). In order to avoid short circuits later on, it is essential that the silicon on side walls of the first insulation structure 9 is removed without any residues during the etching of the second trenches 10. In order to ensure this, a wet etching step using choline, for example, can also be added after the anisotropic dry etching process. The second trenches 10 are etched to a depth of, for example, 500 nm. The second trenches 10 reach down into the first layer 2 but do not cut through the latter. In the finished DRAM cell arrangement, the continuous part of the first layer 2 in each case acts as a bit line. The second trenches 10 have a strip-shaped cross-section parallel to the main area 5. They run essentially parallel and have a width of 250 nm and a length of 128 μm. The distance between the centers of neighbouring second trenches 10 is, for example, 500 nm, that is to say 2F.

After the removal of the mask, the second trenches 10 are filled by depositing an $SiO_2$ layer 11' using a TEOS method to a layer thickness of, for example, 300 nm.

Figure 5:
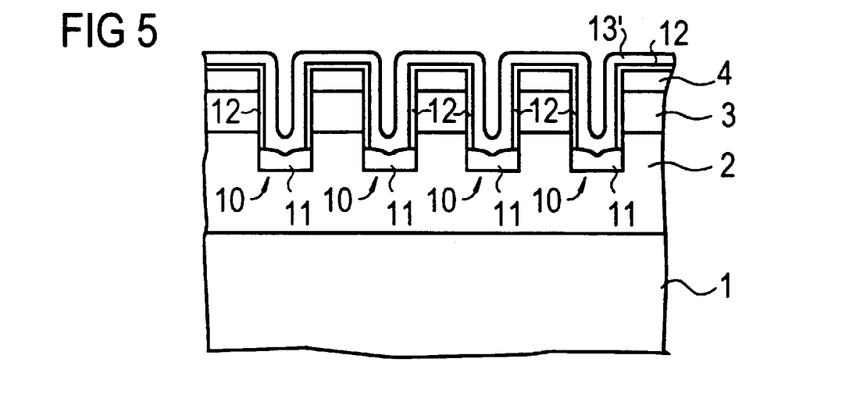
FIG. 5 shows the section, shown in FIG. 4, through the semiconductor substrate after the formation of a gate oxide and the deposition of a doped polysilicon layer.

The $SiO_2$ layer 11' is etched back by anisotropic dry etching, for example using $CHF_3$, $O_2$. In the process, second insulation structures 11 are formed in the second trenches 10 (see FIG. 5). The anisotropic dry etching process attacks $SiO_2$ selectively with respect to silicon. The etching process is continued until the surface of the second insulation structures 11 is situated 400 nm below the main area 5. This dry etching process also attacks the first insulation structures 9, whose surface is situated, after the dry etching process, at the same level as that of the second insulation structure 11. During the etching back process, those surfaces of the third layer 4 and of the second layer 3 which adjoin the flanks of the respective trench are completely exposed in the first trenches 8 and in the second trenches 10. If necessary, this can be ensured by an additional wet etching step, for example using HF(1%).

In order to form a gate oxide 12 on the surface of the second layer 3, thermal oxidation at, for example, 800° C. is subsequently carried out. The gate oxide 12 is formed with a thickness of, for example, 5 nm. During the thermal oxidation, an $SiO_2$ layer having a thickness of 5 nm is formed on all of the exposed silicon surfaces. An in situ-doped polysilicon layer 13' is finally deposited. The doped polysilicon layer, which, for example, is n-doped by phosphorous with a dopant concentration of $10^{21}$ $cm^{-3}$, is deposited to a thickness of 80 nm (see FIG. 5). The doped polysilicon layer 13' is deposited with conformal edge covering. As a result, the second trenches 10 are not filled. The first trenches 8, which have smaller width than the second trenches 10 are, however, filled in the process.

In order to form gate electrodes 13, the doped polysilicon layer 13' is etched back in an anisotropic dry etching process. In the process, the surface of the second insulation structure 11 is exposed in the second trenches 10. That part of the gate electrodes 13 which is arranged in the second trenches 10 becomes a spacer along the flanks of the second trenches 10. The anisotropic etching is carried out, for example, using HBr, $Cl_2$, He and $O_2$, a polysilicon thickness of 150 nm being etched. That is to say that the etching is greatly overdone, with the result that the flanks of the third layer 4 which are covered with gate oxide are exposed in the region of the second trenches 10 (see FIG. 6). The thin $SiO_2$ layer, formed during the gate oxidation, on the surface of the third layer 4 in the region of the main area 5 acts as an etching stop during the anisotropic etching process.

Figure 6:
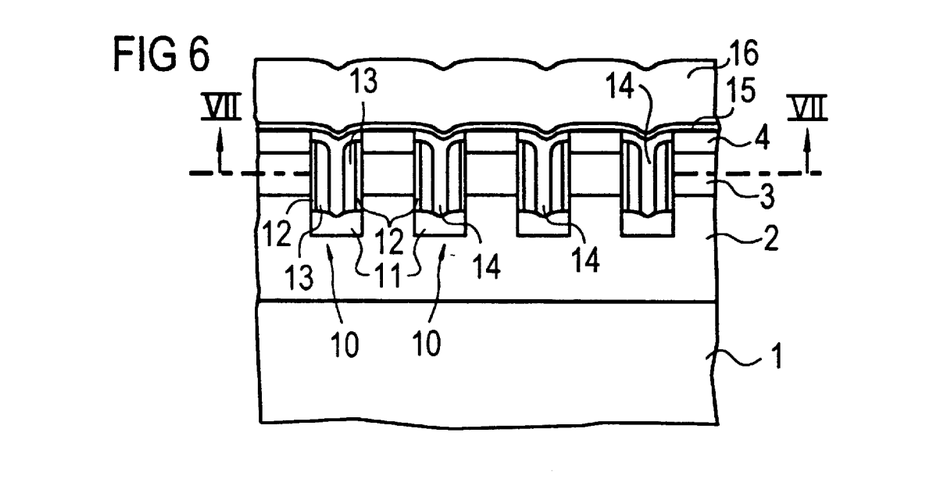
FIG. 6 shows the section, shown in FIG. 5, through the semiconductor substrate after the formation of the gate electrode and completion of the storage capacitors.
Figure 7:
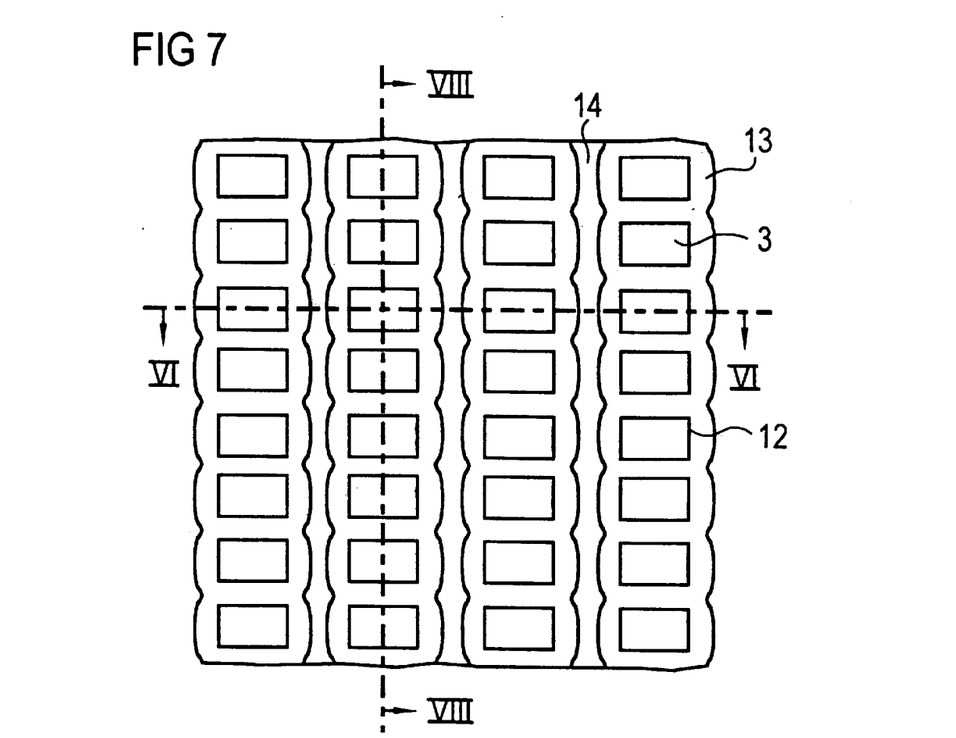
FIG. 7 shows the section through the semiconductor substrate which is designated by VII—VII in FIG. 6.
Figure 8:
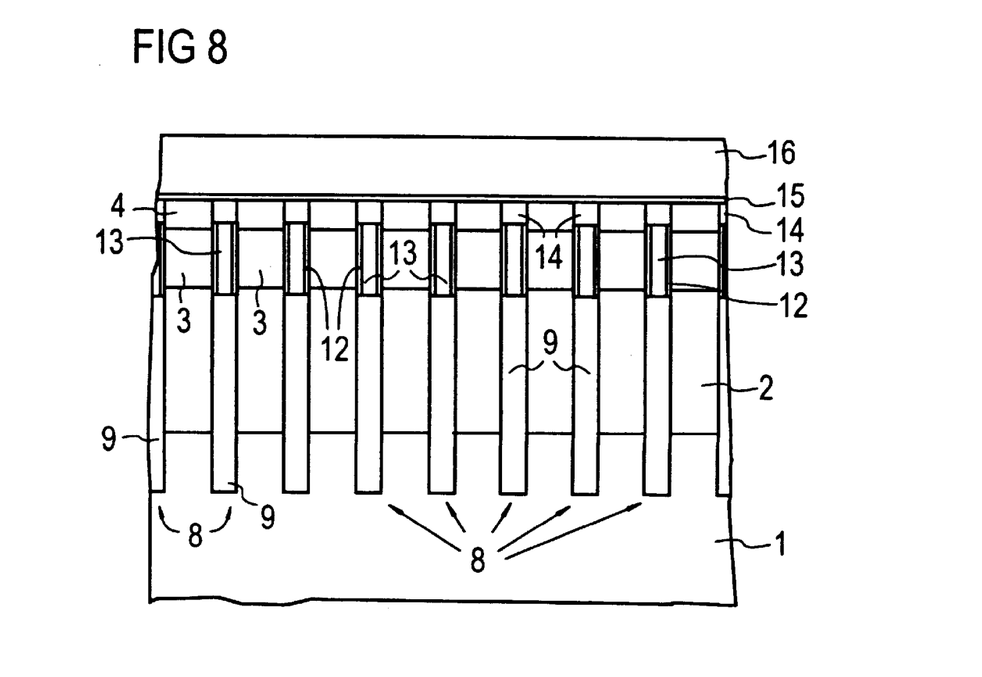
FIG. 8 shows the section through the semiconductor substrate which is designated by VIII—VIII in FIG. 7.

During the anisotropic etching process for forming the gate electrodes 13, the doped polysilicon layer 13' is etched back in the first trenches 8, which are filled by the doped polysilicon layer 13', to a point below the level of the main area 5 (see FIG. 6 and FIG. 8). The gate electrodes 13 in each case annularly surround a part of the second layer 3 which is bounded by two neighbouring first trenches and two neighbouring second trenches (see FIG. 7). Owing to the smaller width of the first trenches 8, neighbouring gate electrodes 13 are connected to one another via the part which is arranged in the respective first trench 8.

A further $SiO_2$ layer is deposited using a TEOS method to a layer thickness of, for example, 150 nm and is anisotropically etched back using a dry etching method. Third insulation structures 14 are produced as a result of this. The third insulation structures 14 insulate gate electrodes 13, which are arranged on opposite flanks of one and the same second trench 10, from one another (see FIG. 6). In the first trenches, the third insulation structures 14 cover the gate electrodes (see FIG. 8). The second trenches 10 are likewise essentially filled by the third insulation structures 14 (see FIG. 6). Only a slight unevenness remains, which can be avoided by depositing the SiO$_2$ layer to a greater thickness.

A capacitor dielectric 15 is subsequently applied. The capacitor dielectric 15 is produced from a material having a high relative permittivity $\in_r$. The capacitor dielectric 15 is preferably formed from barium strontium titanate, strontium titanate or lead zirconium titanate. These ferroelectric and paraelectric layers are applied, for example, by sputtering, using the CVD method or sol-gel method. The capacitor dielectric 15 is produced with a layer thickness of, for example, 50 nm.

In cases where there is reason to fear that the silicon of the third layer 4 may be impaired by the material of the capacitor dielectric 15, it lies within the scope of the invention to provide an intermediate layer made, for example, of TiN, Pt, W or RuO$_2$ between the third layer 4 and the capacitor dielectric 15.

If leakage currents in the capacitor dielectric are not acceptable for a memory application, the capacitor dielectric can be structured. However, an additional mask is necessary for this.

A capacitor plate 16 is applied over the entire area of the capacitor dielectric is 15. For this purpose, a conductive layer, for example made of TiN, Pt, W, RuO$_2$ or n$^+$-doped polysilicon, is deposited. The capacitor plate 16 is formed with a thickness of, for example, 100 nm.

In the DRAM cell arrangement, each memory cell comprises a read-out transistor being the vertical MOS transistor, which is in each case bounded by neighbouring first trenches and neighbouring second trenches, and comprises the part, arranged there, of the first layer 2 as source/drain region, the second layer 3 as channel region and the third layer 4 as source/drain region. The continuous part of the first layer 2 (see FIG. 6) acts as a bit line. Gate electrodes 13 which are adjacent in the direction perpendicular to the bit line direction and are connected to one another in the region of the first trenches 8 form buried word lines. Word lines which are adjacent in the bit line direction are insulated from one another by the third insulation structure. The memory cells furthermore comprise a storage capacitor formed by the respective part of the third layer 4 as storage node, the capacitor dielectric 15 and the capacitor plate 16.

The production of the DRAM cell arrangement requires only two masks: the first mask for the structuring of the first mask layer and of the second mask layer, and the second mask for the etching of the second trenches 10. If the structures in both masks are produced in a manner corresponding to the minimum structure size F which can be produced using the respective technology, then the distance between the centers of neighbouring first trenches 8 is F and the distance between the centers of neighbouring second trenches 10 is 2F, and the resultant space requirement per memory cell is 2F$^2$. If a technology where F=0.25 $\mu$m is taken as a basis, the resultant space requirement per memory cell is 0.125 $\mu$m$^2$. The two lithographically produced masks that are used are non-critical as regards their alignment. No further mask is necessary to structure the gate electrodes and hence the word line. Although other modifications and changes may be suggested by those skilled in the art, it is the intention of the inventors to embody within the patent warranted hereon all changes and modifications as reasonably and properly come within the scope of their contribution to the art.

What is claimed is:

1. A method for producing a DRAM cell arrangement, comprising the steps of:

applying a first mask layer and a second mask layer which can be etched selectively with respect to one another to a semiconductor substrate comprising a first layer which is doped by a first conductivity type, a second layer, which is doped by a second conductivity type opposite to the first, and a third layer, which is doped by the first conductivity type and adjoins a main area of the semiconductor substrate, jointly structuring the second mask layer and the first mask layer, etching back the structured first mask layer under the structured second mask layer by selective etching, removing the structured second mask layer, forming spacers made of a material which can be etched selectively with respect to the material of the structured first mask layer on the flanks of the structured first mask layer, applying a third mask layer having essentially conformal edge covering, said third mask layer having the same etching properties as the first mask layer, etching back the third mask layer selectively with respect to the spacers until the surface of the spacers is partially exposed, selectively removing the spacers with respect to the structured first mask layer and with respect to the structured third mask layer, etching first trenches using the structured first mask layer and the structured third mask layer as an etching mask, said first trenches are each in strip form, run essentially parallel and cut through the first layer, the second layer and the third layer, filling the first trenches with a first insulation structure, etching second trenches, said second trenches are each in strip form, run essentially parallel, cross the first trenches and reach down into the first layer without cutting through the first layer, providing the second trenches with a second insulation structure, a width of the second trenches is greater than the width of the first trenches, selectively etching the first insulation structures and the second insulation structures with respect to the semiconductor material until the surfaces of the structured second layer and third layer are exposed on the flanks of the first trenches and of the second trenches, forming a gate oxide, said gate oxide covers at least the exposed surface of the second layer, producing a conductive layer having essentially conformal edge covering to form gate electrodes, a thickness of said conductive layer is dimensioned such that it fills the first trenches but does not fill the second trenches, and which conductive layer is etched back anisotropically such that conductive spacers are produced on the flanks of the second trenches and the surface of the second insulation structures is partially exposed in the second trenches, while the surface of the first insulation structure in the first trenches remains covered by conductive material, producing a third insulation structure, which covers the gate electrodes, and producing storage capacitors which each have a storage node which is electrically connected to the structured third layer.

2. A method according to claim 1, wherein the first mask layer and the third mask layer are each formed from $SiO_2$ and the second mask layer and the spacers are each formed from $Si_3N_4$, and the conductive layer is formed from doped polysilicon.

3. A method, wherein the semiconductor substrate comprises monocrystalline silicon at least in the region of the main area, and the first layer, the second layer and the third layer are grown on epitaxially.

4. A method according to claim 3, further comprising the steps of:

epitaxially growing on a conductive layer made of CoSi2 under the first layer and cutting through the conductive layer during the etching of the first trenches.

5. A method according to claim 1, further comprising the step of:

applying a capacitor dielectric and a capacitor plate above the structured third layer to form the storage capacitors, with a result that the structured third layer simultaneously acts as a storage node.

6. A method according to claim 5, further comprising the step of:

forming the capacitor dielectric from one of the materials barium strontium titanate, strontium titanate and lead zirconium titanate.

7. A method according to claim 5, wherein the capacitor dielectric is formed as a continuous layer.

* * * * *